United States Patent
Yun et al.

(10) Patent No.: US 9,607,925 B2
(45) Date of Patent: Mar. 28, 2017

(54) SEMICONDUCTOR DEVICE FOR VERIFYING OPERATION OF THROUGH SILICON VIAS

(71) Applicant: SK hynix Inc., Gyeonggi-do (KR)

(72) Inventors: Tae-Sik Yun, Gyeonggi-do (KR);
Kang-Seol Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 22 days.

(21) Appl. No.: 14/487,903

(22) Filed: Sep. 16, 2014

(65) Prior Publication Data

US 2015/0293168 A1    Oct. 15, 2015

(30) Foreign Application Priority Data

Apr. 15, 2014    (KR) .................. 10-2014-0044776

(51) Int. Cl.
| | |
|---|---|
| *H01L 23/58* | (2006.01) |
| *H01L 23/48* | (2006.01) |
| *G01R 31/3185* | (2006.01) |
| *H01L 21/66* | (2006.01) |

(52) U.S. Cl.
CPC .... *H01L 23/481* (2013.01); *G01R 31/318513* (2013.01); *H01L 22/22* (2013.01); *H01L 22/34* (2013.01); *H01L 2924/0002* (2013.01)

(58) Field of Classification Search
CPC ............... H01L 23/481; H01L 25/0657; H01L 2225/06541; H01L 27/11573; H01L 22/22; H01L 22/34; H01L 22/10; H01L 22/12; H01L 22/20; H01L 22/30; H01L 22/32; G06F 11/1048; G01R 31/26; G01R 31/2607; G01R 31/27; G01R 31/2801; G01R 31/2815; G01R 31/2818; G01R 31/282; G01R 31/2831; G01R 31/2832; G01R 31/2896; G01R 31/3187
See application file for complete search history.

(56) References Cited

U.S. PATENT DOCUMENTS

| | | | |
|---|---|---|---|
| 2010/0060310 A1* | 3/2010 | Laisne ................ | H01L 25/0657 326/10 |
| 2011/0102006 A1* | 5/2011 | Choi .............. | G01R 31/318513 324/750.3 |
| 2014/0014957 A1* | 1/2014 | Bae ........................ | H01L 22/34 257/48 |

FOREIGN PATENT DOCUMENTS

| KR | 101094916 | 12/2011 |
|---|---|---|
| KR | 1020120045366 | 5/2012 |

* cited by examiner

*Primary Examiner* — Cory Eskridge
(74) *Attorney, Agent, or Firm* — IP & T Group LLP

(57) ABSTRACT

A semiconductor device may include: a plurality of output paths, which include a plurality of through silicon vias (TSVs), respectively, and suitable for transmission of test confirmation information; an information provider suitable for providing the test confirmation information to the plurality of TSVs; and an output controller suitable for selectively blocking one of the output paths including a failed one among the plurality of TSVs.

11 Claims, 3 Drawing Sheets

SEMICONDUCTOR DEVICE FOR VERIFYING OPERATION OF THROUGH SILICON VIAS

CROSS-REFERENCE TO RELATED APPLICATIONS

The present application claims priority of Korean Patent Application No. 10-2014-0044776, filed on Apr. 15, 2014, which is incorporated herein by reference in its entirety.

BACKGROUND

1. Field

Exemplary embodiments of the present invention relate to a semiconductor design technology, and more particularly, to a semiconductor device for verifying whether a through silicon via (TSV) operates normally.

2. Description of the Related Art

Recent semiconductor device research has focused on increasing speed and integration degree while reducing power consumption. According to 3D stack package technology, two or more chips (or dies) may be vertically stacked. Thus, the chips or dies occupy a small space, and the integration degree is improved within the same area. A through silicon via (TSV) passes through and electrically couples the stacked chips.

A TSV may have various failure modes such as a void, which is formed when a through via is not completely filled with a conductive material, a bump contact fail, and a crack of the TSV. When the TSV has a failure, the TSV cannot perform its normal functions. Therefore, TSVs need to be tested after fabrication to ensure they are functioning properly.

SUMMARY

Various embodiments are directed to a semiconductor device capable of verifying whether a plurality of TSVs normally operate.

In an embodiment, a semiconductor device may include: a plurality of output paths, which include a plurality of through silicon via (TSVs), respectively, and suitable for transmission of a test confirmation information; an information provider suitable for providing the test confirmation information to the plurality of TSVs; and an output controller suitable for selectively blocking one of the output paths including a failed one among the plurality of TSVs.

In an embodiment, a semiconductor device may include: a plurality of output paths, which include a plurality of through silicon vias (TSVs), respectively, and suitable for transmission of a test confirmation information; an information provider suitable for providing the test confirmation information to the plurality of TSVs; a detector suitable for generating a failure information representing the failed ones among the plurality of TSVs by detecting a failure of the plurality of TSVs based on the test confirmation information outputted from the plurality of TSVs; and an output controller suitable for selectively blocking one of the output paths including the failed one among the plurality of TSVs based on the failure information.

In an embodiment, a test method of a semiconductor device may include: a first test step of supplying test confirmation information to a plurality of TSVs, and detecting failure information by sequentially outputting the test confirmation information transmitted to the plurality of TSVs; and a second test step of resetting test target TSVs among the plurality of TSVs according to the failure information, and sequentially outputting the test confirmation information transmitted to the test target TSVs.

DETAILED DESCRIPTION

Figure 1:
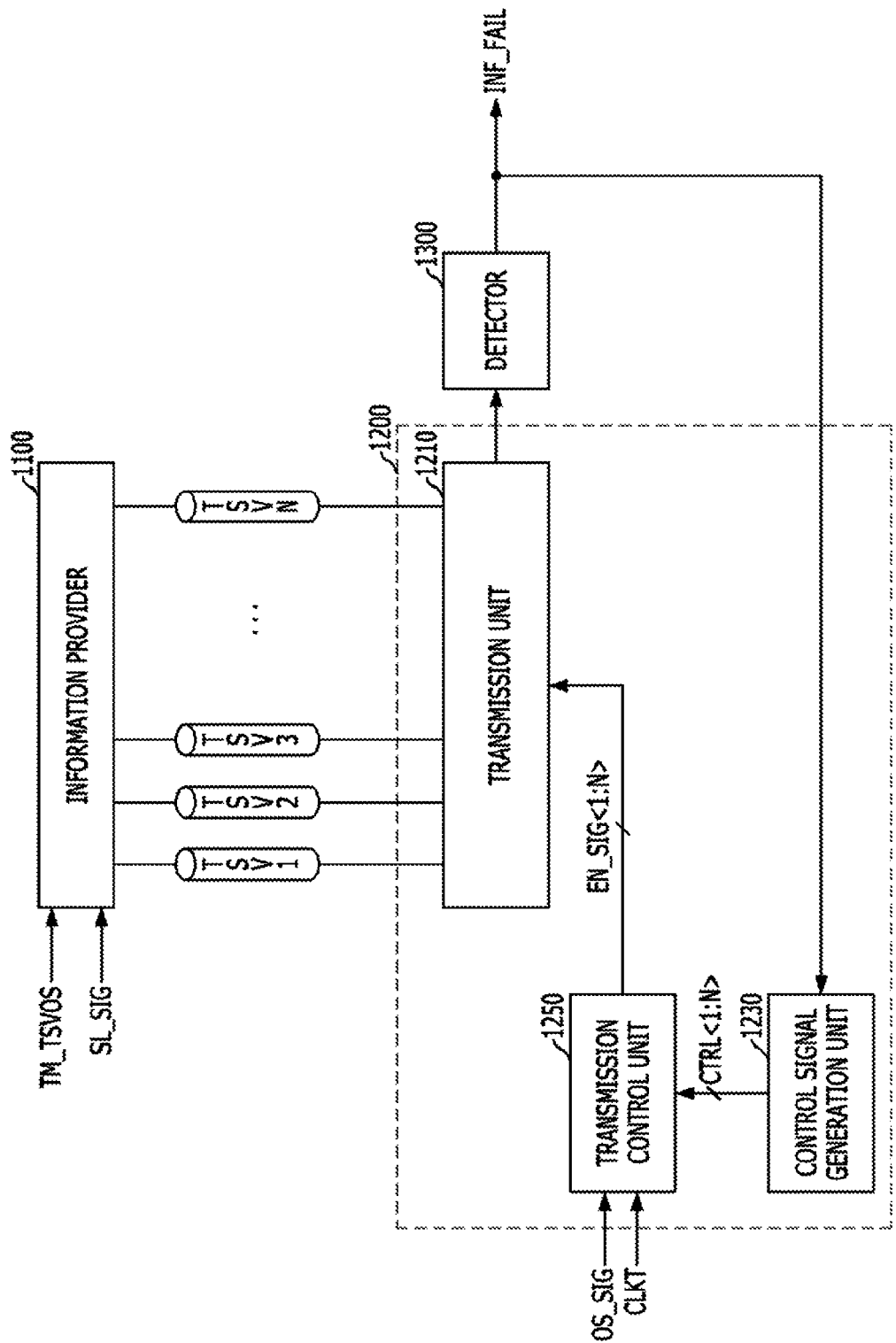
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor device in accordance with an embodiment of the present invention.

Referring to FIG. 1, the semiconductor device 1000 may include a plurality of through silicon vias (TSVs) TSV1 to TSVN, an information provider 1100, an output controller 1200, and a detector 1300.

The semiconductor device 1000 may include a plurality of memory chips stacked in the form of a multi-chip package (not illustrated), and may include the plurality of TSVs TSV1 to TSVN formed vertically through the plurality of stacked memory chips. The plurality of TSVs TSV1 to TSVN may transfer internal voltages, commands, addresses, and data signals among the plurality of stacked memory chips.

The information provider 1100 may provide test confirmation information to the plurality of TSVs TSV1 to TSVN. The information provider 1100 may receive stack information SL_SIG and test mode information TM_TSVOS of the memory chips including the plurality of TSVs TSV1 to TSVN. The test mode information TM_TSVOS may be inputted for a test on the semiconductor device. When the test mode information TM_TSVOS is activated, a test for the semiconductor device may be performed. The stack information SL_SIG may correspond to one among the plurality of memory chips. Thus, the test mode information TM_TSVOS and the stack information SL_SIG may enable the corresponding memory chip. Furthermore, when the corresponding memory chip is enabled, the test confirmation information may be supplied to the plurality of TSVs TSV1 to TSVN. The test confirmation information may represent a test result during a test, and may include a voltage or current supplied to the plurality of TSVs TSV1 to TSVN.

The output controller 1200 may selectively block an output path for outputting the test confirmation information transmitted through the plurality of TSVs TSV1 to TSVN. The output controller 1200 may include a transmission unit 1210, a control signal generation unit 1230, and a transmission control unit 1250. The transmission unit 1210 may selectively transfer the test confirmation information from the plurality of TSVs TSV1 to TSVN to the detector 1300 according to enable signals EN SIG<1:N>.

The control signal generation unit 1230 may generate control signals CTRL<1:N> corresponding to failure information INF_FAIL generated by the detector 1300. Furthermore, the transmission control unit 1250 may generate the enable signals EN_SIG<1:N> for the transmission unit 1210. The transmission control unit 1250 may receive a test pulse signal OS_SIG, a clock signal CLKT, and the control signals CTRL<1:N>, sequentially shift the test pulse signal OS SIG in synchronization with the clock signal CLKT, and generate the enable signals EN_SIG<1:N>. In other words, the output controller 1200 may block the output path for outputting the test confirmation information transferred through the TSV according to the failure information INF_FAIL. This operation will be described in detail with reference to FIG. 2.

The detector 1300 may receive the test confirmation information which is sequentially outputted from the output controller 1200, and generate the failure information INF_FAIL representing failed ones among the plurality of TSVs TSV1 to TSVN by detecting a failure of the plurality of TSVs TSV1 to TSVN based on the test confirmation information. The failure information INF_FAIL may represent whether the plurality of TSVs TSV1 to TSVN have a failure.

Hereafter, the test operation of the semiconductor device will be described.

During a test, the information provider 1100 may apply test confirmation information to the plurality of TSVs TSV1 to TSVN. The transmission unit 1210 may transfer the test confirmation information from the plurality of TSVs TSV1 to TSVN to the detector 1300 in response to the enable signals EN_SIG<1:N>. The detector 1300 may generate the failure information INF_FAIL representing failed ones among the plurality of TSVs TSV1 to TSVN by detecting a failure of the plurality of TSVs TSV1 to TSVN based on the test confirmation information, and provide the failure information INF_FAIL to the control signal generation unit 1230. The control signal generation unit 1230 may generate the control signals CTRL<1:N> corresponding to the failure information INF_FAIL. The output control unit 1200 may control the transmission operation of the transmission unit 1210 according to the control signals CTRL<1:N> generated by the control signal generation unit 1230. The transmission unit 1210 may selectively transfer the test confirmation information from the plurality of TSVs TSV1 to TSVN to the detector 1300 in response to the enable signals EN_SIG<1:N>. As a result, the transmission unit 1210 may selectively block the output path including the failed ones among the plurality of TSVs TSV1 to TSVN corresponding to the failure information INF_FAIL.

The semiconductor device 1000 in accordance with the embodiment of the present invention may generate the failure information INF_FAIL representing failed ones among the plurality of TSVs TSV1 to TSVN by detecting a failure of the plurality of TSVs TSV1 to TSVN based on the test confirmation information, and selectively block the output path including the failed ones among the plurality of TSVs TSV1 to TSVN corresponding to the failure information INF_FAIL.

Figure 2:
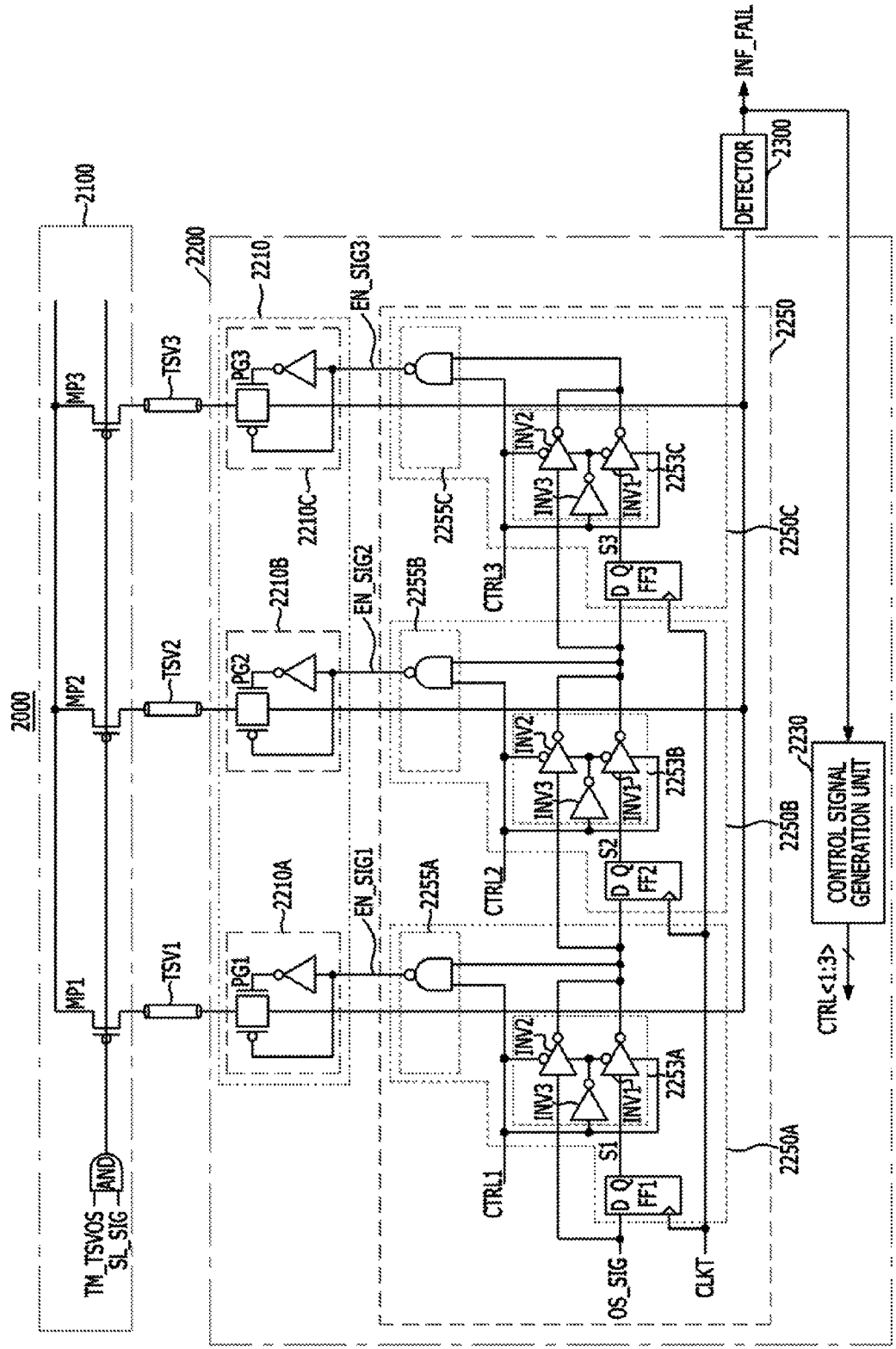
FIG. 2 is a circuit diagram illustrating an example of a semiconductor device shown in FIG. 1.

FIG. 2 is a circuit diagram illustrating an example of a semiconductor device shown in FIG. 1. FIG. 2 exemplarily shows a semiconductor device having three TSVs.

Referring to FIG. 2, the semiconductor device 2000 may include first to third TSVs TSV1 to TSVN an information provider 2100, an output controller 2200, and a detector 2300.

The first to third TSVs TSV1 to TSVN may pass through a plurality of stacked memory chips (not illustrated) to transmit signals between the respective memory chips.

The information provider 2100 may apply test confirmation information to the first to third TSVs TSV1 to TSVN during a test mode. As described above, the test confirmation information may include a voltage or current which is supplied during the test. The information provider 2100 may include transistors, for example. The information provider 2100 may include first to third PMOS transistors MP1 to MP3 coupled to one ends of the first to third TSVs TSV1 to TSVN, respectively. Since the first to third PMOS transistors MP1 to MP3 may be the same as one another. A source of the first PMOS transistor MP1 may be coupled to an external (e.g. an external device) for receiving the test confirmation information. The drain of the first PMOS transistor MP1 may be coupled to one end of the first TSV TSV1. The gate of the first PMOS transistor MP1 may receive a signal from an AND gate AND performing an AND operation to the test mode information TM_TSVOS and stack information SL_SIG. The test mode information TM_TSVOS may be inputted for the test on the semiconductor device. When the test mode information TM_TSVOS is activated, the test for the semiconductor device may be performed, The stack information SL_SIG may correspond to one among the plurality of memory chips. Thus, the test mode information TM_TSVOS and the stack information SL_SIG may enable the corresponding memory chip. Furthermore, when the corresponding memory chip is enabled, the test confirmation information may be supplied to the first to third TSVs TSV1 to TSV3. The test confirmation information may represent a test result during the test, and may include a voltage of current supplied to the first to third TSVs TSV1 to TSV3.

The output controller 2200 may selectively block an output path for outputting the test confirmation information transmitted through the first to third TSVs TSV1 to TSV3. The output controller 2200 may include a transmission unit 2210. The transmission unit 2210 may include first to third transmission sub-units 2210A to 2210C corresponding to the first to third silicon TSVs TSV1 to TSV3, respectively. The output, controller 2200 may further include a control signal generation unit 2230, and a transmission control unit 2250. The first to third transmission sub-units 2210A to 2210C may selectively transmit the test confirmation information received through the first to third TSVs TSV1 to TSV3 to the detector 2300 according to first to third enable signals EN_SIG<1:3>. The first to third transmission sub-units 2210A to 2210C may be the same as one another. The first transmission sub-unit 2210A may be coupled to the other end of the first TSV TSV1. The first transmission sub-unit 2210A may include a pass gate PG1, and an inverter, for example. The pass gate PG1 of the first transmission sub-unit 2210A may be coupled to the detector 2300. When the pass gate PG1 is enabled, the first transmission sub-unit 2210A may transmit the test confirmation information, which is outputted from the corresponding TSV to the detector 2300. The first transmission sub-unit 2210A may be controlled by the first enable signal EN_SIG1. For example, when the first enable signal EN_SIG1 is activated to a low level, the pass gate PG1 may be turned on to transfer the test confirmation information, which is outputted from the first TSV TSV1 to the detector 2300.

The control signal generation unit 2230 may generate first to third control signals CTRL<1:3> corresponding to the failure information INF_FAIL generated by the detector 2300.

The detector 2300 may determine whether each of the first to third TSVs TSV1 to TSV3 is normal or not, based on the test confirmation information transferred from the first to third TSVs TSV1 to TSV3 through the first to third transmission sub-units 2210A to 2210C. The failure information INF_FAIL may be stored in a failure information storage unit (not illustrated), and the control signal generation unit 2230 may generate the first to third control signals CTRL<1:3> in response to the failure information INF_FAIL stored in the failure information storage unit. The failure information storage unit may include a fuse. The failure information storage unit may receive the failure information INF_FAIL generated by the detector 2300, and program the received failure information INF_FAIL into the fuse. The control signal generation unit 2230 may read the programmed fuse and generate the first to third control signals CTRL<1:3> corresponding to the failure information INF_FAIL. In other words, the first to third control signals CTRL<1:3> may be activated or deactivated according to the failure information INF_FAIL.

The transmission control unit 2250 may include first to third transmission control sub-units 2250A to 2250C. The first to third transmission control sub-units 2250A to 2250C may include a synchronizer, a path control section and an enable signal generation, respectively. The first transmission control sub-unit 2250A may include first synchronizers FF1, first path control sections 2253A and first enable signal generation section 2255A. The second transmission control sub-unit 2250B may include first synchronizers FF2, first path control sections 2253B and first enable signal generation section 2255B. The third transmission control sub-unit 2250C may include first synchronizers FF3, first path control sections 2253C and first enable signal generation section 2255C. The first to third synchronizers FF1 to FF3 corresponding to the first to third TSVs TSV1 to TSV3, respectively. The first to third path control sections 2253A to 2253C corresponding to the first to, third TSVs TSV1 to TSV3, respectively, and first to third enable signal generation sections 2255A to 2255C.

The transmission control unit 2250 may receive a test pulse signal OS_SIG, a clock signal CLKT, and the first to third control signals CTRL<1:3>. The first to third synchronizers FF1 to FF3 may sequentially shift the test pulse signal OS_SIG in synchronization with the clock signal CLKT. Each of the first to third synchronizers FF1 to FF3 may be implemented with a flip-flop, respectively. The first synchronizer FF1 may shift the test pulse signal OS_SIG in synchronization with the clock signal CLKT, and output the shifted test pulse signal OS_SIG as a first test pulse signal S1. Similarly, each of the second and third synchronizers FF2 and FF3 may shift an output signal, which is outputted from one of the first and second path control sections 2253A to 2253B of the previous stage, in synchronization with the clock signal CLKT, and output second and third test pulse signals S2 and S3. In the present embodiment, the synchronizers are implemented with flip-flops. However, the synchronizers may include any structure as long as they can output an input signal in synchronization with a clock signal.

The first to third path control sections 2253A to 2253C may control the transmission path of the first to third test pulse signals S1 to S3 outputted from the first to third synchronizers FF1 to FF3 according to the first to third control signals CTRL<1:3>. The first to third path control sections 2253A to 2253C may be the same as one another.

The first path control section 2253A may transmit one of the first test pulse signal S1 and the test pulse signal OS_SIG to the second synchronizer FF2 in response to the first control signal CTRL1. The first path control section 2253A may include three inverters INV1 to INV3. The first inverter INV1 may receive and invert the first test pulse signal S1 outputted from the first synchronizer FF1. The second inverter INV2 may receive and invert the test pulse signal OS_SIG. The third inverter INV3 may receive the first control signal CTRL1, and control enablement of the first and second inverters INV2. One of the first test pulse signal S1 inputted to the first inverter INV1 and the test pulse signal OS_SIG inputted to the second inverter INV2 may be inverted and applied to the second synchronizer FF2 and the first enable signal generation section 2255A according to the output signal of the third inverter INV3.

The operation of the first path control section 2253A will now be described. When the first control signal CTRL1 is activated, the third inverter INV3 may enable the first inverter INV1 and disable the second inverter INV2. As the first inverter INV1 is enabled, the first test pulse signal S1 may be inverted and applied to the input terminal D of the second synchronizer FF2 and the first enable signal generation section 2255A. On the other hand, when the first control signal CTRL1 is deactivated, the third inverter INV3 may disable the first inverter INV1 and enable the second inverter INV2. As the second inverter INV2 is enabled, the test pulse signal OS_SIG may be inverted and applied to the second synchronizer FF2 and the first enable signal generation section 2255A.

That is, the first path control section 2253A may invert and transmit one of the first test pulse signal S1 and the test pulse signal OS_SIG to the second synchronizer FF2 and the first enable signal generation section 2255A according to the first control signal CTRL. Thus, the first to third path control sections 2253A to 2253C may transmit one of the first to third test pulse signals S1 to S3, and the test pulse signal OS_SIG to the second and third synchronizers FF2 and FF3 and the first to third enable signal generation sections 2255A to 2255C in response to the first to third control signals CTRL<1:3>, respectively.

The first to third enable signal generation sections 2255A to 2255C may generate first to third enable signals EN_SIG<1.3> in response to the first to third control signals CTRL<1:3> and the test pulse signals outputted from the first to third path control sections 2253A to 2253C. Each of the first to third enable signal generation sections 2255A to 2255C may include a NAND gate. The first to third transmission sub-units 2210A to 2210C may be controlled in response to the generated first to third enable signals EN_SIG<1:3>.

The detector 2300 may receive the test confirmation information which is sequentially outputted from the output controller 2200, and generate the failure information INF_FAIL representing failed ones among the first to third TSVs TSV1 to TSV3 by detecting a failure of the first to third TSVs TSV1 to TSV3 based on the test confirmation information. The detector 2300 may receive the test confirmation information and determine whether the first to third TSVs TSV1 to TSV3 are normal or not. For example, the detector 2300 may be implemented with a pad or differential amplifier provided in the semiconductor device. When the detector 2300 is implemented with the pad, the detector 2300 may receive a current flowing through the first to third TSVs TSV1 to TSV3 as the test confirmation information. Thus, the amount of current flowing through the first to third TSVs TSV1 to TSV3 may be recognized by an external test device or an external probe coupled to the pad. The amount of current flowing through the first to third TSVs TSV1 to TSV3 and a reference value may be compared to check the failure information of the first to third TSVs TSV1 to TSV3. Furthermore, when the detector 2300 is implemented with a differential amplifier, the detector 2300 may differentially amplify the voltage outputted from the first to third TSVs TSV1 to TSV3 and the reference voltage, and generate the failure information INF_FAIL. When the level of the output voltage from the first to third TSVs TSV1 to TSV3 is higher than the level of the reference voltage, the detector 2300 may generate the failure information INF_FAIL.

Now, the overall operation of the semiconductor device 2000 will be described.

When the test mode information TM_TSVOS and the stack information SL_SIG are activated during the test. The first to third PMOS transistors MP1 to MP3 may be turned on, and the test confirmation information may be supplied to the first to third TSVs TSV1 to TSV3. When the failure information INF_FAIL is not yet detected, the first to third control signals CTRL<1:3> may have the same level, that is, the high level. The first synchronizer may receive and shift the test pulse signal OS_SIG in synchronization with the clock signal CLKT, and generate the first test pulse signal S1. The first path control section 2253A may invert and apply the first test pulse signal S1 outputted from the first synchronizer FF1 to the second synchronizer FF2 and the first enable signal generation section 2255A in response to the first control signal CTRL1 having the high level. The second synchronizer FF2 may receive and shift the inverted first test pulse signal S1 outputted from the first path control section 2253A in synchronization with the clock signal CLKT, and generate the second test pulse signal S2. The second path control section 2253B may invert and apply the second test pulse signal S2 outputted from the second synchronizer FF2 to the third synchronizer FF3 and the second enable signal generation section 2255B in response to the second control signal CTRL2 having the high level. The third synchronizer FF3 may receive and shift the inverted second test pulse signal S2 outputted from the second path control section 2253B in synchronization with the clock signal CLKT, and generate the third test pulse signal S3. Furthermore, the third path control section 2253C may invert and apply the third test pulse signal S3 outputted from the third synchronizer FF3 to the third enable signal generation section 2255C in response to the third control signal CTRL3 having the high level.

As such, the pass gate PG1 of the first transmission sub-unit 2210A may be enabled in response to the first control signal CTRL1 having the high level and the inverted first test pulse signal S1 applied to the first enable signal generation section 2255A. Accordingly, the first TSV TSV1 may transmit the test confirmation information of the first TSV TSV1 to the detector 2300.

The pass gate PG2 of the second transmission sub-unit 2210B may be enabled in response to the second control signal CTRL2 having the high level and the inverted second pulse signal S2 applied to the second enable signal generation section 2255B. Accordingly, the second TSV TSV2 may transmit the test confirmation information of the second TSV TSV2 to the detector 2300.

The pass gate PG3 of the third transmission sub-unit 2210C may be enabled in response to the third control signal CTRL3 having the high level and the inverted third test pulse signal S3 applied to the third enable signal generation section 2255C. Accordingly, the third TSV TSV3 may transmit the test confirmation information of the third TSV TSV3 to the detector 2300.

As described above, the pass gates PG1 to PG3 of the first to third transmission sub-units 2210A to 2210C may be sequentially enabled in response to the shifted first to third test pulse signals S<1:3>. Thus, the test confirmation information may be sequentially transmitted from each of the first to third TSVs TSV1 to TSV3 to the detector 2300. The detector 2300 may compare the test confirmation information outputted from each of the first to third TSVs TSV1 to TSV3 to the reference voltage, and determine whether the corresponding TSV is normally coupled or opened. As such, the detector 2300 may generate the failure information INF_FAIL corresponding to a failed TSV among the first to third TSVs TSV1 to TSV3. The control signal generation section 2230 may generate first to third control signals CTRL<1:3> corresponding to the failure information INF_FAIL.

For example, when the second TSV TSV2 is detected as failed, the test confirmation information outputted through the second TSV TSV2 may be detected as a failure, and the second control signal CTRL2 generated through the control signal generation unit 2230 may be deactivated to the low level. When the first and third TSVs TSV1 and TSV3 are detected as normal, the control signal generation unit 2230 may activate the first and third control signals CTRL1 and CTRL3 to the high level.

Then, the semiconductor device 2000 may perform a second test after the first test for generating the failure information INF_FAIL corresponding to the failed second TSV TSV2. The information provider 2100 may receive the test mode information TM_TSVOS and the stack information SL_SIG, and transmit test confirmation information to the first to third TSVs TSV1 to TSV3. The first synchronizer FF1 may receive the test pulse signal OS_SIG and output the first test pulse signal S1 shifted in synchronization with the clock signal CLKT. The first path control section 2253A may invert and apply the first test pulse signal S1 outputted from the first synchronizer FF1 to the second synchronizer FF2 and the first enable signal generation section 2255A in response to the first control signal CTRL1 being activated to the high level. The first enable signal generation section 2255A may receive the first control signal CTRL1 activated to the high level and the inverted first test pulse signal S1, and may generate the activated first enable signal EN_SIG1. The pass gate PG1 of the first transmission sub-unit 2210A may be enabled in response to the first enable signal EN_SIG1, and transmit the test confirmation information of the first TSV TSV1 to the detector 2300.

The first test pulse signal S1 shifted by the first synchronizer FF1 may be inverted and inputted to the second synchronizer FF2, and the second synchronizer FF2 may output the second test pulse signal S2 shifted in synchronization with the clock signal CLKT. However, the second path control section 2253B may invert and apply the first test pulse signal S1, which is shifted and inverted by the first synchronizer FF1 and the first path control section 2253A, to the third synchronizer FF3 and the second enable signal generation section 2255B in response to the second control signal CTRL2 activated to the low level. The second path control section 2253B may block the transmission path of the second test pulse signal S2 outputted from the second synchronizer FF2 in response to the second control signal CTRL2 having the low level. The second enable signal generation section 2255B receiving the second control signal CTRL2 activated to the low level and the inverted first test pulse signal S1 may generate the deactivated second enable signal EN_SIG2. Thus, the pass gate PG2 of the second transmission sub-unit 2210B may block the transmission of the test confirmation information from the second TSV TSV2 to the detector 2300.

The third synchronizer FF3 may receive and shift the first test pulse signal S1, which is shifted and inverted by the first synchronizer FF1 and the first path control section 2253A, and further inverted by the second path control section 2253B, in synchronization with the clock signal CLKT, and generate the third test pulse signal S3. The third path control section 2253C may invert and apply the third test pulse signal S3 outputted from the third synchronizer FF3 to the third enable signal generation section 2255C in response to the third control signal CTRL3 activated to the high level. The third enable signal generation section 2255C may generate the activated third enable signal EN_SIG3 in response to the third control signal CTRL3 activated to the high level and the third test pulse signal S3. In response to the third enable signal EN_SIG3, the pass gate PG3 of the third transmission sub-unit 2210C may transmit the test confirmation information of the third TSV TSV3 to the detector 2300.

That is, as the second TSV TSV2 is detected as failed, the second control signal CTRL2 may be deactivated, the second enable signal generation section 2255B may deactivate the second enable signal EN_SIG2 and the second transmission sub-unit 2210B may be disabled. As the second control signal CTRL2 is deactivated, the second test pulse signal S2 outputted from the second synchronizer FF2 may not be transmitted, but the inverted first test pulse signal S1 may be inputted to the third synchronizer FF3. Thus, according to the first control signal CTRL1 and the first test pulse signal S1, the first enable signal EN_SIG1 may enable the first transmission sub-unit 2210A. Furthermore, according to the third control signal CTRL3 and the third test pulse signal S3 the third enable signal EN_SIG3 may be enable the third transmission sub-unit 2210C. The first and second transmission sub-units 2210A and 2210C excluding the second transmission sub-unit 22106 may be enabled to sequentially detect the test confirmation information through the first and third TSVs TSV1 and TSV3.

The semiconductor device in accordance with the embodiment of the present invention may detect the failure information INF_FAIL of the first to third TSVs TSV1 to TSV3 and generate the first to third control signals CTRL<1: 3> corresponding to the failure information INF_FAIL, during the first test operation. Then, the first to third transmission sub-units 2210A to 2210C may selectively transfer the test confirmation information from the first to third TSVs TSV1 to TSV3 to the detector 2300 in response to the first to third enable signal's EN_SIG<1:3>. As a result, the first to third transmission sub-units 2210A to 2210C may selectively block the output path including the failed ones among the first to third TSVs TSV1 to TSV3 corresponding to the failure information INF_FAIL. Thus, during the first test operation, the test for the three TSVs, that is, the first to third TSVs TSV1 to TSV3 may be performed to detect failure information. During the second test operation, however, the second TSV TSV2 having failure information INF_FAIL among the three TSVs may be excluded to perform a test on the two TSVs. This indicates that the test operation time of the first test and the test operation time of the second test may differ from each other depending on the failure information INF_FAIL.

Furthermore, the test operation time of the first to third TSVs TSV1 to TSV3 may be varied according to the failure information INF_FAIL. That is, the semiconductor device may block the output path including the failed one among the first to third TSVs TSV1 to TSV3 corresponding to the failure information INF_FAIL, and enable only the test target TSVs to sequentially perform the test on the TSVs except for the failed TSV. Thus, the entire test operation period may be reduced. In the semiconductor device in accordance with the embodiment of FIG. 2, it has been described that the output controller 2200 controls the shifting operation through the failure information and sequentially tests the plurality of TSVs. However, the plurality of TSVs may be selectively controlled and tested according to control signal.

Figure 3:
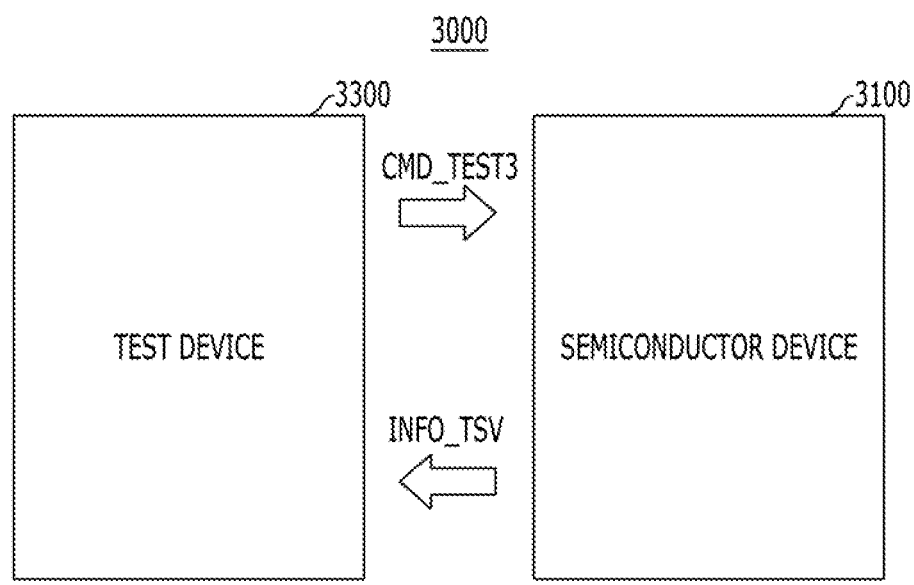
FIG. 3 is a block diagram illustrating a test system in accordance with an embodiment of the present invention.

FIG. 3 is a block diagram illustrating a test system in accordance with an embodiment of the present invention.

Referring to FIG. 3, the test system 3000 may include a semiconductor device 3100 and a test device 3300.

The semiconductor device 3100 may be the same as the semiconductor device described above with reference to FIG. 2. During the first test, the test confirmation information applied to a plurality of TSVs may be sequentially outputted. Furthermore, during the second test, the test confirmation information transmitted through the plurality of TSVs except for the failed TSV may be sequentially outputted.

The semiconductor device 3100 may sequentially output the test confirmation information transmitted through the plurality of TSVs during the first test. Through the outputted test confirmation information, failure information INFO_TSV of the plurality of TSVs, which corresponds to the failure information INF_FAIL described above with reference to FIGS. 1 and 2, may be generated. Then, during the second test, the test conformation information transmitted through the plurality of TSVs, except for the failed TSV corresponding to the failure information INFO_TSV, may be sequentially outputted. Thus, the operation time of the first test and the operation time of the second test may differ from each other depending on the failure information INFO_TSV.

The test device 3300 may receive the failure information INFO_TSV from the semiconductor device 3100, and control the start time of a third test which is performed after the second test. The test device 3300 may transmit a command CMD_TEST3 for the third test to the semiconductor device 3100. The semiconductor device 3100 may perform the third test through the command CMD_TEST3 applied from the test device 3300.

In the test system 3000 in accordance with the embodiment of the present invention, the test device 3300 may receive the failure information INFO_TSV corresponding to the failed ones among the plurality of TSVs from the semiconductor device 3100, and control the time at which the third test operation of the semiconductor device 3100 is started. Thus, the start time of the third test operation may be controlled to reduce the time required for the test of the semiconductor device 3100.

In accordance with the embodiments of the present invention, the semiconductor device may generate the failure information corresponding to the failed ones among the plurality of TSVs, and reduce the test time required for verifying whether the plurality of TSVs normally operate.

Although various embodiments have been described for illustrative purposes, it will be apparent to those skilled in the art that various changes and modifications may be made without departing from the spirit and scope of the invention as defined in the following claims.

What is claimed is:
1. A semiconductor device comprising:
  a plurality of output paths, which include a plurality of through silicon vias (TSVs), respectively, that are suitable for transmission of test confirmation information;
  an information provider suitable for receiving stack information on a corresponding memory chip among a plurality of memory chips including the plurality of TSVs, and test mode information of the plurality of memory chips, and providing the test confirmation information to the plurality of TSVs; and an output controller suitable for selectively blocking one of the output paths including a failed one among the plurality of TSVs, wherein the output controller comprises:
a transmission unit suitable for transmitting the test confirmation information outputted from each of the plurality of TSVs to a detector; and
a transmission control unit suitable for selectively enabling the transmission of the test confirmation information of the transmission unit according to the failure information,
wherein the transmission control unit comprises a plurality of transmission control sub-units corresponding to the plurality of TSVs,
wherein each of the plurality of transmission control sub-units comprises:
a synchronizer suitable for generating a shifted pulse signal by sequentially shifting an input pulse signal in synchronization with a clock signal;
a path control section suitable for generating a selected pulse signal by selecting one of the input pulse signal and the shifted pulse signal in response to the failure information; and
an enable signal generation section suitable for generating the enable signal for the corresponding TSV in response to the failure information and the selected pulse signal.

2. The semiconductor device of claim 1, wherein the detector generates failure information representing the failed ones among the plurality of TSVs by detecting a failure of the plurality of TSVs based on the test confirmation information outputted from the output controller.

3. The semiconductor device of claim 1, wherein the transmission control unit further comprises:
a plurality of transmission sub-units corresponding to the plurality of transmission control sub-units, respectively, each of which transfers the test confirmation information from the corresponding TSV to the detector in response to the enable signal for the corresponding TSV.

4. The semiconductor device of claim 1, wherein the plurality of transmission control sub-units are serially coupled, and wherein the input pulse signal of a following transmission control sub-unit is the selected pulse signal of a previous transmission control sub-unit.

5. The semiconductor device of claim 4, wherein the output controller further comprises a control signal generation unit suitable for generating a control signal corresponding to the failure information.

6. The semiconductor device of claim 5, wherein the enable signal generation section receives the control signal and the selected pulse signal.

7. The semiconductor device of claim 1, wherein the test operation times of the plurality of TSVs are varied according to the failure information.

8. The semiconductor device of claim 1, wherein the test confirmation information comprises a voltage or current supplied during a test.

9. A semiconductor device comprising:
a plurality of output paths, which include a plurality of through silicon vias (TSVs), respectively, are suitable for transmission of test confirmation information;
an information provider suitable for receiving stack information on a corresponding memory chip among a plurality of memory chips including the plurality of TSVs, and test mode information of the plurality of memory chips, and providing test confirmation information to the plurality of TSVs;
a detector suitable for generating failure information representing the failed ones among the plurality of TSVs by detecting a failure of the plurality of TSVs based on the test confirmation information outputted from the plurality of TSVs; and
an output controller suitable for selectively blocking one of output paths including a failed one among the plurality of TSVs based on the failure information,
wherein the output controller comprises:
a transmission unit suitable for transmitting the test confirmation information outputted from each of the TSVs to the detector; and
a transmission control unit suitable for selectively enabling the transmission of the test confirmation information of the transmission unit according to the failure information,
wherein the transmission control unit comprises a plurality of transmission control sub-units corresponding to the plurality of TSVs respectively,
wherein each of the plurality of transmission control sub-units comprises:
a synchronizer suitable for generating a shifted pulse signal by sequentially shifting an input pulse signal in synchronization with a clock signal;
a path control section suitable for generating a selected pulse signal by selecting one of the input pulse signal and the shifted pulse signal in response to the failure information; and
an enable signal generation section suitable for generating the enable signal for the corresponding TSV in response to the failure information and the selected pulse signal.

10. The semiconductor device of claim 9, wherein the transmission control unit further comprises:
a plurality of transmission sub-units corresponding to the plurality of transmission control sub-units respectively, each of which transfers the test confirmation information from the corresponding TSV to the detector in response to the enable signal for the corresponding TSV.

11. The semiconductor device of claim 10,
wherein the plurality of transmission control sub-units are serially coupled, and
wherein the input pulse signal of a following transmission control sub-unit is the selected pulse signal of a previous transmission control sub-unit.

* * * * *